United States Patent [19]
Jacobson et al.

[11] Patent Number: 5,696,934
[45] Date of Patent: Dec. 9, 1997

[54] METHOD OF UTILIZING STORAGE DISKS OF DIFFERING CAPACITY IN A SINGLE STORAGE VOLUME IN A HIERARCHIAL DISK ARRAY

[75] Inventors: Michael B. Jacobson; Marvin D. Nelson, both of Boise, Id.

[73] Assignee: Hewlett-Packard Company, Palo Alto, Calif.

[21] Appl. No.: 797,214

[22] Filed: Feb. 11, 1997

Related U.S. Application Data

[63] Continuation of Ser. No. 263,695, Jun. 22, 1994, abandoned.

[51] Int. Cl.⁶ .................................................. G06F 12/00
[52] U.S. Cl. .................. 395/441; 395/182.03; 371/10.2
[58] Field of Search ............................ 395/404–406, 395/438–441, 444, 497.01, 497.02, 497.03, 497.04, 500, 800, 825, 833; 371/10.2, 21.1, 40.1

[56] References Cited

U.S. PATENT DOCUMENTS

| | | | |
|---|---|---|---|
| 5,124,987 | 6/1992 | Milligan et al. | 371/10.1 |
| 5,155,835 | 10/1992 | Belson | 395/425 |
| 5,195,100 | 3/1993 | Katz et al. | 395/182.2 |
| 5,278,838 | 1/1994 | Ng et al. | 395/182.04 |
| 5,287,462 | 2/1994 | Jibbe et al. | 395/856 |
| 5,301,297 | 4/1994 | Menon et al. | 395/425 |
| 5,379,385 | 1/1995 | Shomler | 395/325 |
| 5,392,244 | 2/1995 | Jacobson et al. | 365/200 |
| 5,423,046 | 6/1995 | Nunnelley et al. | 395/750 |
| 5,430,855 | 7/1995 | Walsh et al. | 395/830 |
| 5,432,922 | 7/1995 | Polyzois et al. | 395/425 |
| 5,479,653 | 12/1995 | Jones | 395/182.03 |
| 5,485,475 | 1/1996 | Takagi | 371/40.4 |
| 5,490,260 | 2/1996 | Miller et al. | 395/427 |
| 5,499,253 | 3/1996 | Lary | 371/40.1 |
| 5,515,500 | 5/1996 | Mizuno et al. | 395/182.05 |
| 5,517,632 | 5/1996 | Matsumoto et al. | 395/441 |
| 5,519,844 | 5/1996 | Stallmo | 395/441 |

*Primary Examiner*—Alpesh M. Shah

[57] ABSTRACT

The methods concern fully utilizing storage capacity in a heterogenous hierarchic disk array having storage disks of differing capacities. The disks are segmented into multiple regions. One method links non-contiguous regions from individual storage disks to form RAID areas. The RAID areas are mapped into a virtual storage space that provides a view of the physical storage space as a single storage volume. Data is then stored in these RAID areas according to different redundancy criteria, such as RAID Level 1 and RAID Level 5. A second method fully utilizes of storage capacity by configuring the heterogeneous disk array to employ a minimum of two equal-sized storage disks that have larger capacity than other individual storage disks in the disk array. The contiguous regions across the multiple disks are then grouped together to form the RAID areas.

8 Claims, 7 Drawing Sheets

Fig. 1

DISKS

| 0 | 1 | 2 | 3 | STRIPE NUMBER |
|---|---|---|---|---|
| 0 | 0' | 1 | 1' | 0 |
| 2 | 2' | 3 | 3' | 1 |
| 4 | 4' | 5 | 5' | 2 |
| 6 | 6' | 7 | 7' | 3 |
| * | * | * | * | * |
| * | * | * | * | * |
| * | * | * | * | * |
| T-1 | T-1' | T | T' | S |

Fig. 2

DISKS

| 0 | 1 | 2 | 3 | STRIPE NUMBER |
|---|---|---|---|---|
| 0 | 1 | 2 | P | 0 |
| 3 | 4 | P | 5 | 1 |
| 6 | P | 7 | 8 | 2 |
| P | 9 | 10 | 11 | 3 |
| * | * | * | * | * |
| * | * | * | * | * |
| * | * | * | * | * |
| P | R-2 | R-1 | R | Q |

METHOD OF UTILIZING STORAGE DISKS OF DIFFERING CAPACITY IN A SINGLE STORAGE VOLUME IN A HIERARCHIAL DISK ARRAY

CROSS REFERENCE TO RELATED APPLICATION

This is a continuation of application Ser. No. 08/263,695 filed on Jun. 22, 1994, now abandoned.

FIELD OF THE INVENTION

This invention relates to data storage systems, such as a hierarchic disk array data storage systems, and methods for utilizing storage disks of differing capacity in a single storage volume in such systems.

BACKGROUND OF THE INVENTION

Computer systems are constantly improving in terms of speed, reliability, and processing capability. As a result, computers are able to handle more complex and sophisticated applications. However, as computers improve, performance demands placed on mass storage and input/output (I/O) devices increase. There is a continuing need to design mass storage systems that keep pace in terms of performance with evolving computer systems.

This invention particularly concerns the mass storage systems of the disk array type. Disk array data storage systems have multiple storage disk drive devices which are arranged and coordinated to form a single mass storage system. There are three primary design criteria for mass storage systems: cost, performance, and availability. It is most desirable to produce memory devices that have a low cost per megabyte, a high input/output performance, and high data availability. "Availability" is the ability to recover data stored in the storage system even though some of the data has become inaccessible due to failure or some other reason and the ability to insure continued operation in the event of such failure. Typically, data availability is provided through the use of redundancy wherein data, or relationships among data, are stored in multiple locations.

There are two common methods of storing redundant data. According to the first or "mirror" method, data is duplicated and stored in two separate areas of the storage system. For example, in a disk array, the identical data is provided on two separate disks in the disk array. The mirror method has the advantages of high performance and high data availability due to the duplex storing technique. However, the mirror method is also relatively expensive as it effectively doubles the cost of storing data.

In the second or "parity" method, a portion of the storage area is used to store redundant data, but the size of the redundant storage area is less than the remaining storage space used to store the original data. For example, in a disk array having five disks, four disks might be used to store data with the fifth disk being dedicated to storing redundant data. The parity method is advantageous because it is less costly than the mirror method, but it also has lower performance and availability characteristics in comparison to the mirror method.

One problem encountered in the design of disk array data storage systems concerns maximizing the use of storage capacity presented by the storage disks, while maintaining the desired availability and reliability of the data through redundancy. This problem is less troublesome for "homogeneous" disk arrays which employ storage disk drive devices of equal storage capacity. On the other hand, the problem is clearly manifest in "heterogeneous" disk arrays which use storage disks of different storage capacity. Conventional heterogenous disk arrays often fail to utilize the portion of capacity on each storage disk that exceeds the capacity of the smallest disk in the configuration. This under utilization undesirably leads to a higher cost of storage.

One prior art solution is to present the uneven storage disks of differing capacity to the host computer system as multiple independent storage volumes. This solution has the drawback of increased complexity and difficulty in capacity planning and data management.

Another related problem concerns adding storage disk drive devices of larger capacity to an existing disk array data storage system. Evolving technology is ever improving the storage capacity of disk drive devices and thus, storage disks that are purchased later to increase storage capacity of an existing disk array typically have larger capacity than older disks presently found in the disk array. Adding these new larger disks can imbalance a previously homogeneous disk array, as well as further diversify an already heterogenous disk array. In conventional disk arrays, the additional storage capacity of the new disks is often wasted because it exceeds the capacity of the smallest disk in the configuration.

Accordingly, there is a need to improve utilization of all storage capacity in a disk array data storage system, while maintaining data availability, without resorting to defining multiple independent storage volumes. There is also a need for disk arrays to accommodate additional storage disks of different capacity and utilize their entire capacity.

SUMMARY OF THE INVENTION

This invention provides methods for utilizing uneven storage disks of differing capacity in a heterogeneous hierarchic disk array. The invention achieves this full utilization without presenting the storage disks of different capacities as separate storage volumes, but instead presents them to the host computer system as a single volume.

According to one method for utilizing storage capacity, a heterogenous hierarchic disk array is configured to include a minimum of two equal-sized storage disks which are also the largest in capacity of the storage disks in the disk array. All of the storage disks in the array are then segmented into multiple regions. RAID areas are formed from contiguous regions across the multiple disks. The contiguous regions represent physical storage space at the same physical addresses on individual storage disks.

The RAID areas are mapped into a virtual storage space that provides a view of the physical storage space as a single storage volume. Data can then be stored in the RAID areas according to selected RAID levels (such as RAID Level 1 or RAID Level 5) where each RAID area stores some redundant data. The two or more largest disks can therefore be used to store data according to mirror redundancy (for two disks or more disks of largest capacity) and/or parity redundancy (for three or more disks of largest capacity) in the contiguous storage regions that exceed the next largest capacity disks.

Another method for utilizing storage capacity is to link non-contiguous regions from individual storage disks to form the RAID areas. Unlike contiguous regions, these non-contiguous regions represent physical storage space at different physical addresses scattered throughout the various multiple storage disks. The RAID areas are again mapped into a virtual storage space that provides a view of the physical storage space as a single storage volume. Data is stored in the RAID areas according to selected RAID levels where each RAID area stores some redundant data.

DESCRIPTION OF THE DRAWINGS

Preferred embodiments of the invention are described below with reference to the following accompanying drawings depicting examples embodying the best mode for practicing the invention.

FIG. 5 is diagrammatic illustration of storage space on multiple storage disks of differing capacity, wherein the two largest disks have the same capacity. FIG. 5 demonstrates the method of forming contiguous areas on the storage disks, including the two largest disks, for data redundancy storage.

FIG. 7 is diagrammatic illustration of storage space on multiple storage disks of differing capacity, wherein one disk has larger capacity than the remaining disks. FIG. 7 demonstrates the method of forming non-contiguous areas across the disks to utilize all space on the disks.

DETAILED DESCRIPTION OF THE INVENTION

This disclosure of the invention is submitted in furtherance of the constitutional purposes of the U.S. Patent Laws "to promote the progress of science and useful arts". U.S. Constitution, Article 1, Section 8.

Figure 1:
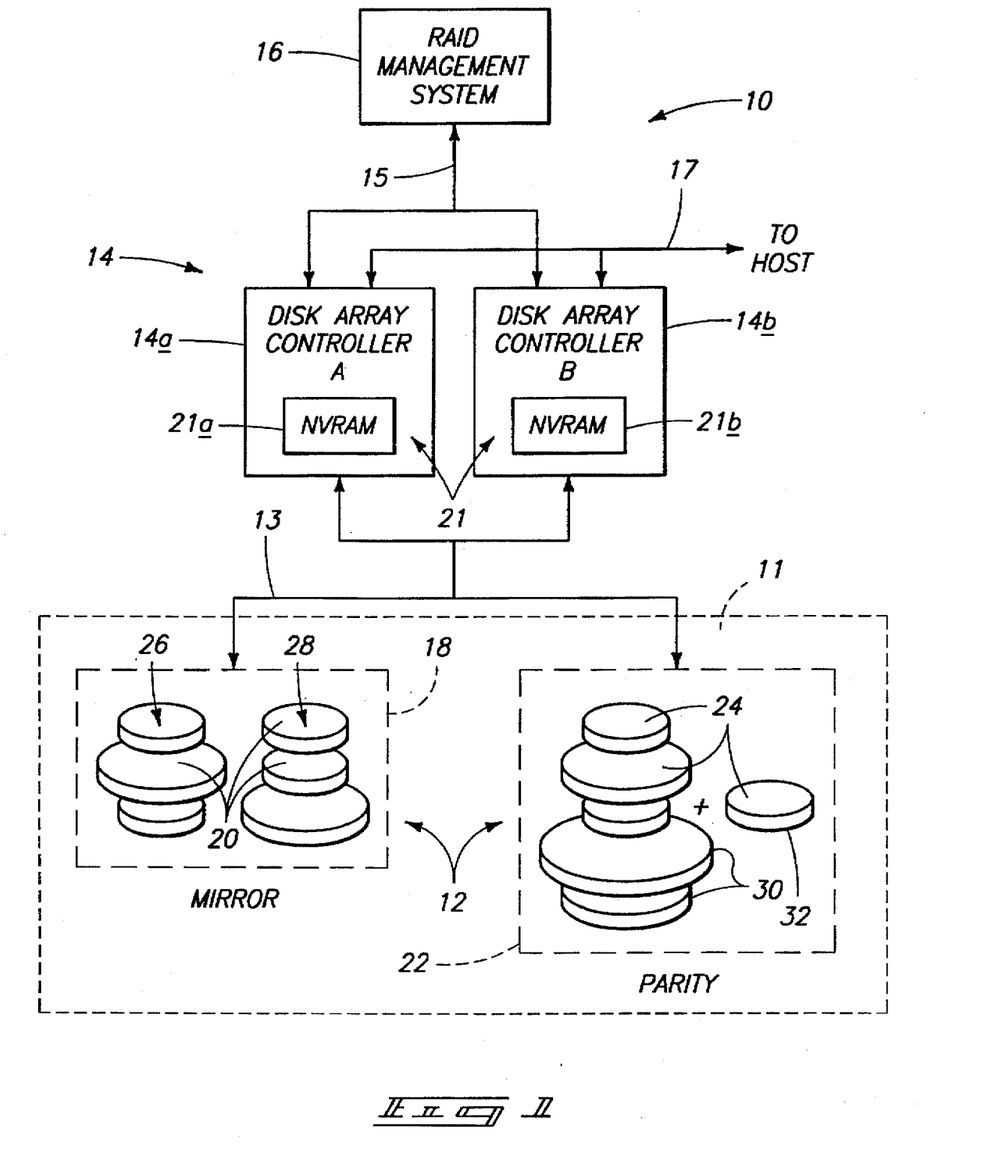
FIG. 1 is a diagrammatic block diagram of a memory system according to this invention.

FIG. 1 shows a data storage system 10 constructed according to this invention. Preferably, data storage system 10 is a disk array data storage system which includes a heterogeneous hierarchic disk array 11 having a plurality of uneven storage disks 12 of differing storage capacities. The data storage system 10 also includes a disk array controller 14 coupled to the disk array 11 to coordinate data transfer to and from the storage disks 12, and a RAID management system 16.

For purposes of this disclosure, a "disk" is any non-volatile, randomly accessible, rewritable mass storage device which has the ability of detecting its own storage failures. It includes both rotating magnetic and optical disks and solid-state disks, or non-volatile electronic storage elements (such as PROMs, EPROMs, and EEPROMs). The term "disk array" is a collection of disks, the hardware required to connect them to one or more host computers, and management software used to control the operation of the physical disks and present them as one or more virtual disks to the host operating environment. A "virtual disk" is an abstract entity realized in the disk array by the management software. The terms "single volume" or "volume set" mean a group of physical storage disks that belong together and function as a unit.

The term "RAID" (Redundant Array of Independent Disks) means a disk array in which part of the physical storage capacity is used to store redundant information about user data stored on the remainder of the storage capacity. The redundant information enables regeneration of user data in the event that one of the array's member disks or the access path to it fails. A more detailed discussion of RAID systems is found in a book entitled, *The RAIDBook: A Source Book for RAID Technology*, published Jun. 9, 1993, by the RAID Advisory Board, Lino Lakes, Minn.

Disk array controller 14 is coupled to disk array 11 via one or more interface buses 13, such as a small computer system interface (SCSI). RAID management system 16 is operatively coupled to disk array controller 14 via an interface protocol 15. Data memory system 10 is also coupled to a host computer (not shown) via an I/O interface bus 17. RAID management system 16 can be embodied as a separate component, or configured within disk array controller 14, or within the host computer. RAID management system 16 provides a data manager means for controlling disk storage and reliability levels, and for transferring data among various reliability storage levels. These reliability storage levels are preferably mirror or parity redundancy levels as described below, but can also include a reliability storage level with no redundancy at all.

The disk array controller 14 is preferably implemented as a dual controller consisting of disk array controller A 14a and disk array controller B 14b. The dual controllers 14a and 14b enhance reliability by providing continuous backup and redundancy in the event that one controller becomes inoperable. The methods of this invention, however, can be practiced with a single controller, or other controller configurations.

Hierarchic disk array 11 can be characterizable as different storage spaces, including its physical storage space and one or more virtual storage spaces. These various views of storage are related through mapping techniques. For example, the physical storage space of the disk array can be mapped into a virtual storage space which delineates storage areas according to the various data reliability levels. Some areas within the virtual storage space can be allocated for a first reliability storage level, such as mirror or RAID Level 1, and other areas can be allocated for a second reliability storage level, such as parity or RAID Level 5. The various mapping techniques and virtual spaces concerning RAID levels are described below in more detail with reference to FIG. 4.

Data storage system 10 includes a memory map store 21 that provides for persistent storage of the virtual mapping information used to map different storage spaces onto one another. The memory map store is external to the disk array, and preferably resident in the disk array controller 14. The memory mapping information can be continually or periodically updated by the controller or RAID management system as the various mapping configurations among the different views change.

Preferably, memory map store 21 is embodied as two non-volatile RAMs (Random Access Memory) 21a and 21b which are located in respective controllers 14a and 14b. An example non-volatile RAM (NVRAM) is a battery-backed RAM. A battery-backed RAM uses energy from an independent battery source to maintain the data in the memory for a period of time in the event of power loss to data storage system 10. One preferred construction is a self-refreshing, battery-backed DRAM (Dynamic RAM).

The dual NVRAMs 21a and 21b provide for redundant storage of the memory mapping information. The virtual mapping information is duplicated and stored in both NVRAMs 21a and 21b according to mirror redundancy techniques. In this manner, NVRAM 21a can be dedicated to storing the original mapping information and NVRAM 21b can be dedicated to storing the redundant mapping information. In an alternative construction, a mirrored memory map store can be configured using a single non-volatile RAM with sufficient space to store the data in duplicate.

As shown in FIG. 1, the heterogenous disk array 11 has multiple uneven storage disk drive devices 12 having different sized capacity. Example sizes of these storage disks are one, two, or three Gigabytes, although other sizes are also suitable. Despite the differing capacity, storage disks 12 are presented to the host computer as a single volume set where the multiple disks function together as a cohesive unit of memory. Additionally, the data storage system 10 is designed to permit "hot plug" of additional disks of similar or differing capacity into available mechanical bays in the disk array while the disk array is in operation. The storage disks can be independently connected or disconnected to mechanical bays that provide interfacing with SCSI bus 13. Disk array controller 14 recognizes storage disks 12 regardless into which bay they are plugged.

The storage disks 12 in disk array 11 can be conceptualized, for purposes of explanation, as being arranged in a mirror group 18 of multiple disks 20 and a parity group 22 of multiple disks 24. Mirror group 18 represents a first memory location or RAID area of the disk array which stores data according to a first or mirror redundancy level. This mirror redundancy level is also considered a RAID Level 1. RAID Level 1, or disk mirroring, offers the highest data reliability by providing one-to-one protection in that every bit of data is duplicated and stored within the data storage system. The mirror redundancy is diagrammatically represented by the three pairs of disks 20 in FIG. 1. Original data can be stored on a first set of disks 26 while duplicative, redundant data is stored on the paired second set of disks 28.

Figure 2:
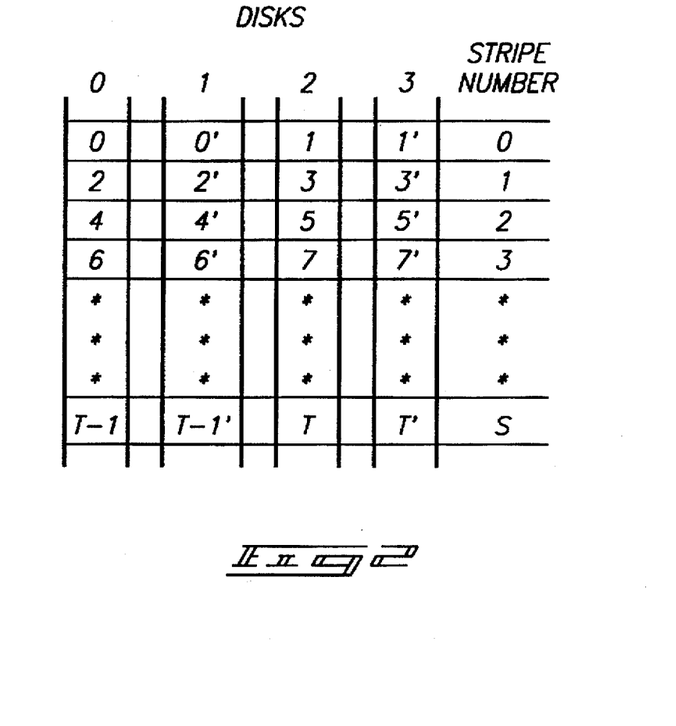
FIG. 2 is a diagrammatic illustration of storage space on multiple storage disks and shows data storage according to RAID Level 1.

FIG. 2 illustrates the storage of data according to RAID Level 1 in more detail. The vertical columns represent individual disks, of which disks 0, 1, 2, and 3 are illustrated. The physical storage space contained in this disk array of four disks can be configured into multiple stripes, as represented by the horizontal rows. A "stripe" extends across the storage disks and is comprised of numerous, equal sized segments of storage space where one segment is associated with each disk in the array. That is, a segment is the portion of a stripe that resides on a single disk. Each stripe holds a predetermined amount of data which is distributed across the storage disks. Some segments of a stripe are used for original data while other segments are used for redundant data.

In this example of mirror redundancy (RAID Level 1), data stored on disk 0 in segment 0 of stripe 0 is duplicated and stored on disk 1 in segment 0' of stripe 0. Similarly, data stored on disk 2 in segment 5 of stripe 2 is mirrored into segment 5' of stripe 2 on disk 3. In this manner, each piece of data is duplicated and stored on the disks. The redundancy layout of FIG. 2 is provided for explanation purposes. The redundant data need not be placed neatly in the same stripe as is shown. For example, data stored on disk 0 in segment 2 of stripe 1 could be duplicated and placed on disk 3 in segment T' of stripe S.

With reference again to FIG. 1, the parity group 22 of disks 24 represent a second memory location or RAID area in which data is stored according to a second redundancy level, such as RAID Level 5. In this explanatory illustration of six disks, original data is stored on the five disks 30 and redundant "parity" data is stored on the sixth disk 32.

Figure 3:
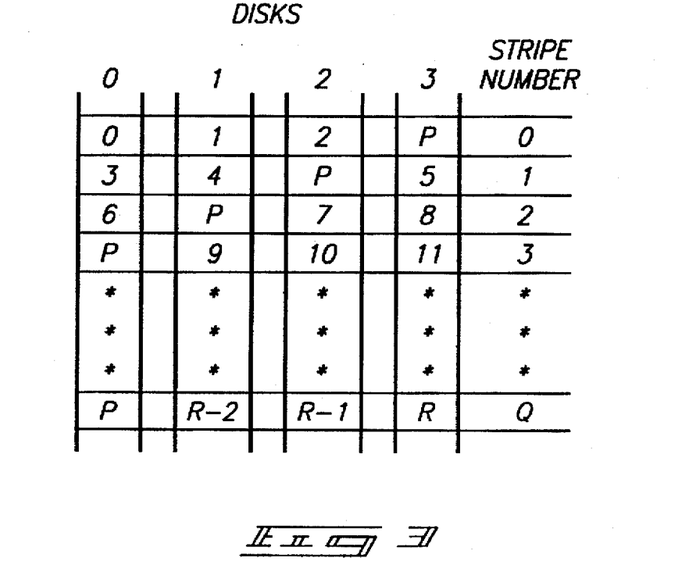
FIG. 3 is a diagrammatic illustration of storage space on multiple storage disks and shows data storage according to RAID Level 5.

FIG. 3 shows a parity RAID area layout in more detail. Similar to the mirror RAID area layout of FIG. 2, the physical storage space of disks 0, 1, 2, 3 can be configured into multiple equal sized stripes. In this illustrated example, data is stored according to RAID Level 5 and the redundant data stored in the segments is referenced by letter P. The redundant P segments store the parity of the other segments in the stripe. For example, in stripe 0, the redundant P segment on disk 3 stores the parity of disks 0, 1, and 2. The parity for each stripe is computed by some function, such as an exclusive OR function which is represented by the symbol "$\oplus$". The parities for the first four stripes (with the subscript numeral representing the corresponding stripe) are as follows:

$$P_0 = \text{Segment 0} \oplus \text{Segment 1} \oplus \text{Segment 2}$$
$$= \text{Disk 0} \oplus \text{Disk 1} \oplus \text{Disk 2}$$
$$P_1 = \text{Segment 3} \oplus \text{Segment 4} \oplus \text{Segment 5}$$
$$= \text{Disk 0} \oplus \text{Disk 1} \oplus \text{Disk 3}$$
$$P_2 = \text{Segment 6} \oplus \text{Segment 7} \oplus \text{Segment 8}$$
$$= \text{Disk 0} \oplus \text{Disk 2} \oplus \text{Disk 3}$$
$$P_3 = \text{Segment 9} \oplus \text{Segment 10} \oplus \text{Segment 11}$$
$$= \text{Disk 1} \oplus \text{Disk 2} \oplus \text{Disk 3}$$

Parity redundancy allows regeneration of data which becomes unavailable on one of the disks. For example, if the data in segment 5 becomes unavailable, its contents can be ascertained from segments 3 and 4 and the parity data in segment P. Parity storage is less expensive than mirror storage, but is also less reliable and has a lower performance.

The disk arrangement of FIG. 1 is provided for conceptual purposes. In practice, the disk array 11 would simply have a plurality of disks 12 which are capable of storing data according to mirror and parity redundancy. Among the available storage space provided by all disks 12, a portion of that storage space would be allocated for mirror redundancy and another portion would be allocated for parity redundancy. Preferably, disks 12 are configured to contain plural, equal sized storage regions (referenced as numeral 35 in FIG. 4), wherein individual regions have multiple segments. Additionally, a uniform view of the entire storage space is presented to the user or host so that the RAID areas and data redundancy storing techniques are transparent to the user or host. These features are discussed below in more detail with reference to FIG. 4.

Data storage system 10 manages the "migration" of data between mirror and parity storage schemes. The management of both types of redundancy is coordinated by RAID management system 16 (FIG. 1). RAID management system 16 manages the two different types of RAID areas in the disk array as a memory hierarchy with the mirror RAID areas acting similar to a cache for the parity RAID areas. Once data is moved from a parity RAID area to a mirror RAID area, the space it once occupied in the parity RAID area is available for storage of other data. RAID management system 16 shifts, organizes, and otherwise manages the data between the mirror and parity RAID areas in accordance with a defined performance protocol. The process of moving data between the mirror and parity RAID areas is referred to as "migration".

Data storage system 10 places the more critical data in the mirror RAID areas since this affords the highest performance and reliability. The performance protocols implemented by RAID management system 16 includes one of two preferred migration policies. According to the first migration policy, known as "access frequency", the most frequently accessed data on the hierarchic disk array is maintained in the mirror RAID area 18. Less frequently accessed data is maintained in the parity RAID area 22. According to a second migration policy, known as "access recency", the most recently retrieved data is maintained in the mirror RAID area 18 while the less recently accessed data is stored in parity RAID area 22. Other performance protocols may be employed. Ideally, such protocols are defined based upon the specific computer application and the needs of the user.

In this manner, the RAID management system 16 effectively "tunes" the storage resources of a data storage system according to the application or user requirements. For instance, in an application requiring high performance and reliability, the RAID management system may create and define a proportionally larger mirror RAID area, thereby dedicating a larger amount of physical storage capacity to mirror redundancy, in comparison to the parity RAID area. Conversely, in an application where cost is premium and less importance is placed on performance or reliability, the RAID management system may establish a proportionally larger parity RAID area in comparison to the mirror RAID area. Accordingly, the data storage system of this invention affords maximum flexibility and adaptation.

Figure 4:
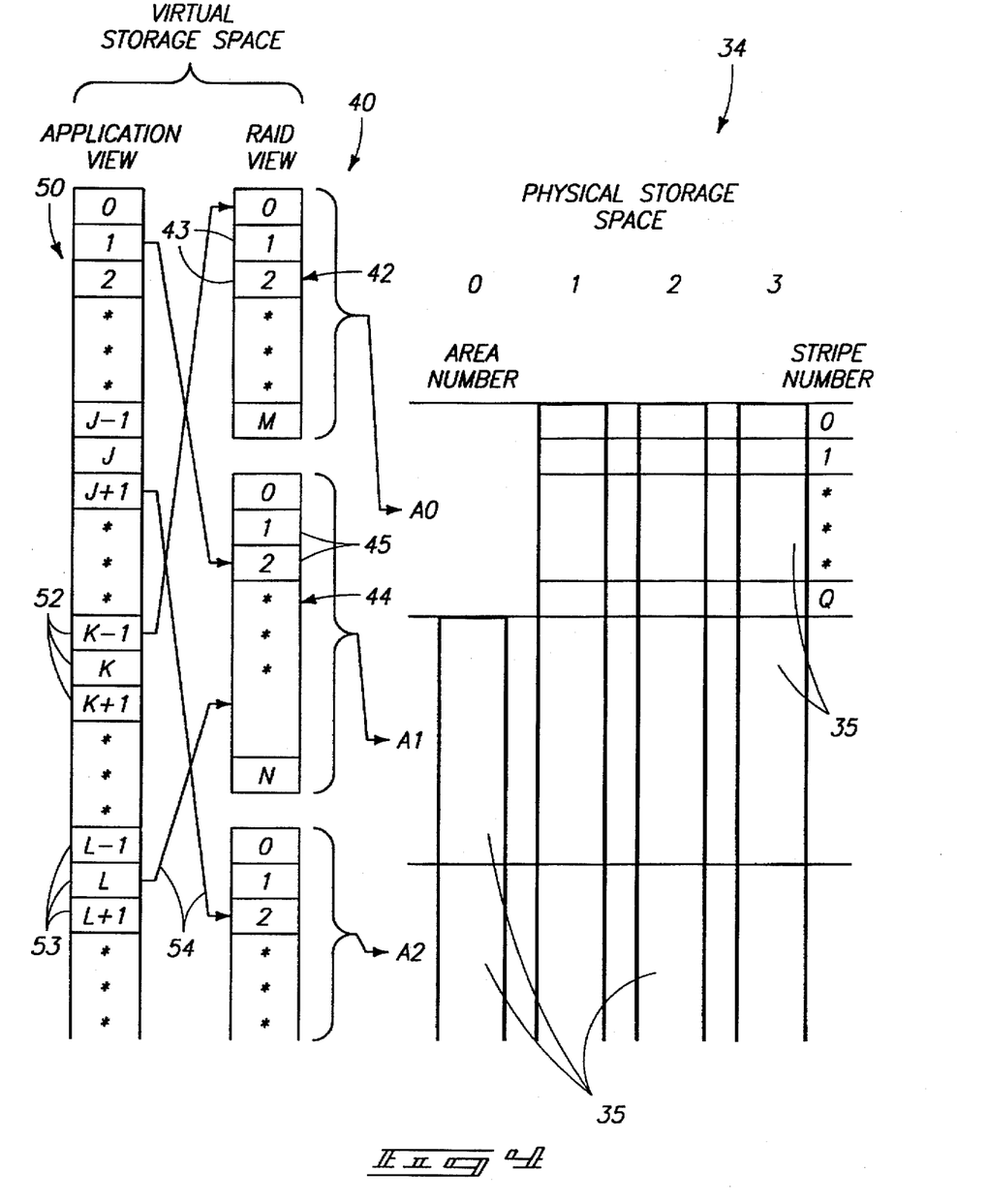
FIG. 4 is a diagrammatic illustration of a memory mapping arrangement of this invention where two virtual storage spaces are mapped onto a physical storage space.

FIG. 4 illustrates a memory mapping of the available storage space of data storage system 10 as multiple tiers of mapped virtual storage space. Each vertically elongated rectangle in the diagram represents a view of the physical storage space. In this diagram, physical storage space 34 is referenced by two virtual storage views 40 and 50. Physical storage space 34 is represented by four disks (such as disks 12 in FIG. 1) referenced by numerals 0, 1, 2, and 3. The four rectangles associated with the disks represent a view of the physical storage space wherein disks 1, 2, and 3 have approximately equal storage capacity, and disk 0 has slightly less storage capacity. The storage space 34 is partitioned into areas A0, A1, A2, etc. Individual areas contain numerous stripes, such as stripes 0–Q in area A0. Individual areas also contain numerous regions 35. Regions 35 preferably consist of a selected number of uniform sized segments on every storage disk so that the regions are equal in size across the entire disk array, The storage space of the disks are mapped into a first or intermediate virtual view 40 of the physical storage space 34. This first virtual view is conceptually a set of RAID areas which, when viewed by the user or host application program, represents one large storage space indicative of the storage space on the disks 0, 1, 2, and 3. Accordingly, the height of the rectangle in the RAID areas is shown as higher than those of the disks.

The RAID area storage space 40 is the view of storage that identifies the mirror and parity storage space. For instance, a RAID area 42 may represent a mirror RAID area of M blocks 43 while RAID area 44 may represent a parity RAID area of N blocks 45. These RAID areas relate to corresponding physical areas A0, A1, A2, etc., on the physical storage space 34. The mirror and parity RAID areas may or may not consume the entire storage space 34 of the disk array. Accordingly, during certain applications, there may be unused and undesignated storage space that does not correspond to a particular RAID area. However, such storage space can be converted into a mirror or parity RAID area.

The storage space available in the RAID areas is mapped into a second or front end virtual view 50 which is a view of storage presented to the user or host application program.

When viewed by the user or host application program, second virtual view 50 also represents a single large storage capacity indicative of the available storage space on storage disks 12. Virtual storage space 50 presents a view of a linear set of equal sized storage blocks 52 and 53, referenced individually as 0, 1, 2, ... J−1, J, J+1, ..., L−1, L, L+1, ..., etc. The virtual block storage space 50 is represented by a table of references or pointers to storage blocks in the view presented by RAID areas 40 (as represented by arrows 54). There are at least two RAID areas that can be referenced from the virtual block table so that both mirror and parity storage areas are available. Preferably, the storage capacity of RAID areas 40 is divided into blocks of the same size as those of the virtual block view of storage space.

The RAID management system 16 can dynamically alter the configuration of the RAID areas. The RAID areas may be enlarged or shrunk depending upon the data reliability needs at a particular time. As a result, the mapping of the RAID areas in the first virtual view 40 onto the disks and the mapping of the front end virtual view 50 to RAID view 40 are generally in a state of change. The memory map store in NVRAMs 21a and 21b (FIG. 1) maintain the current mapping information used by RAID management system 16 to map the RAID areas onto the disks, as well as the information employed to map between the two virtual views. As the RAID management system dynamically alters the RAID level mappings, it also updates the mapping information in memory map store 21 to reflect the alterations.

The migration operation of data storage system 10 is described in more detail in co-pending U.S. patent application Ser. No. 08/109,137, filed Aug. 19, 1993, which issued as U.S. Pat. No. 5,392,244 on Feb. 21, 1995, and also assigned to Hewlett-Packard. This patent application is incorporated herein by reference.

The methods for maximizing utilization of storage capacity in a heterogenous hierarchic disk array will now be described with reference to FIGS. 5–8.

Figure 5:
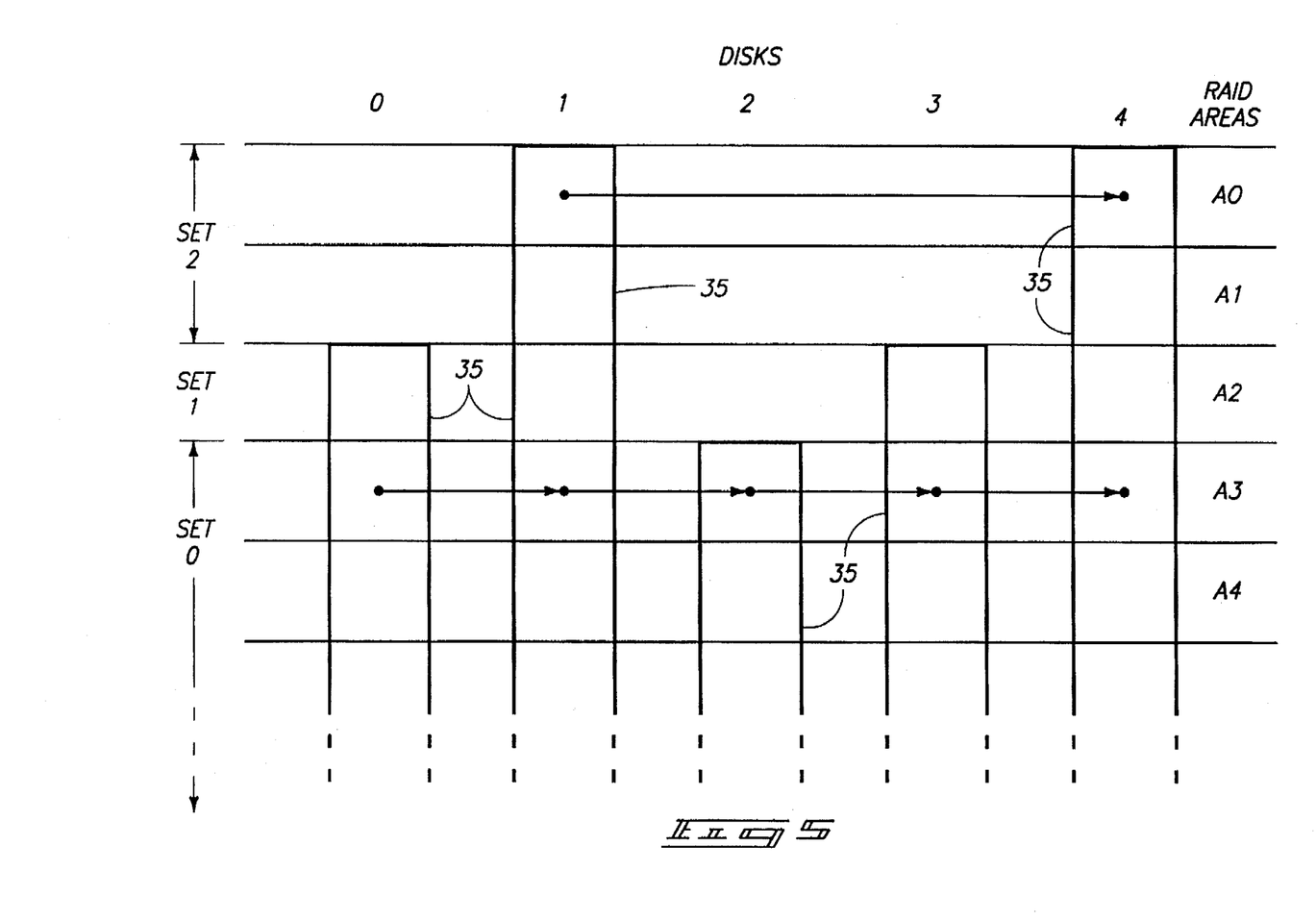
Figure 6:
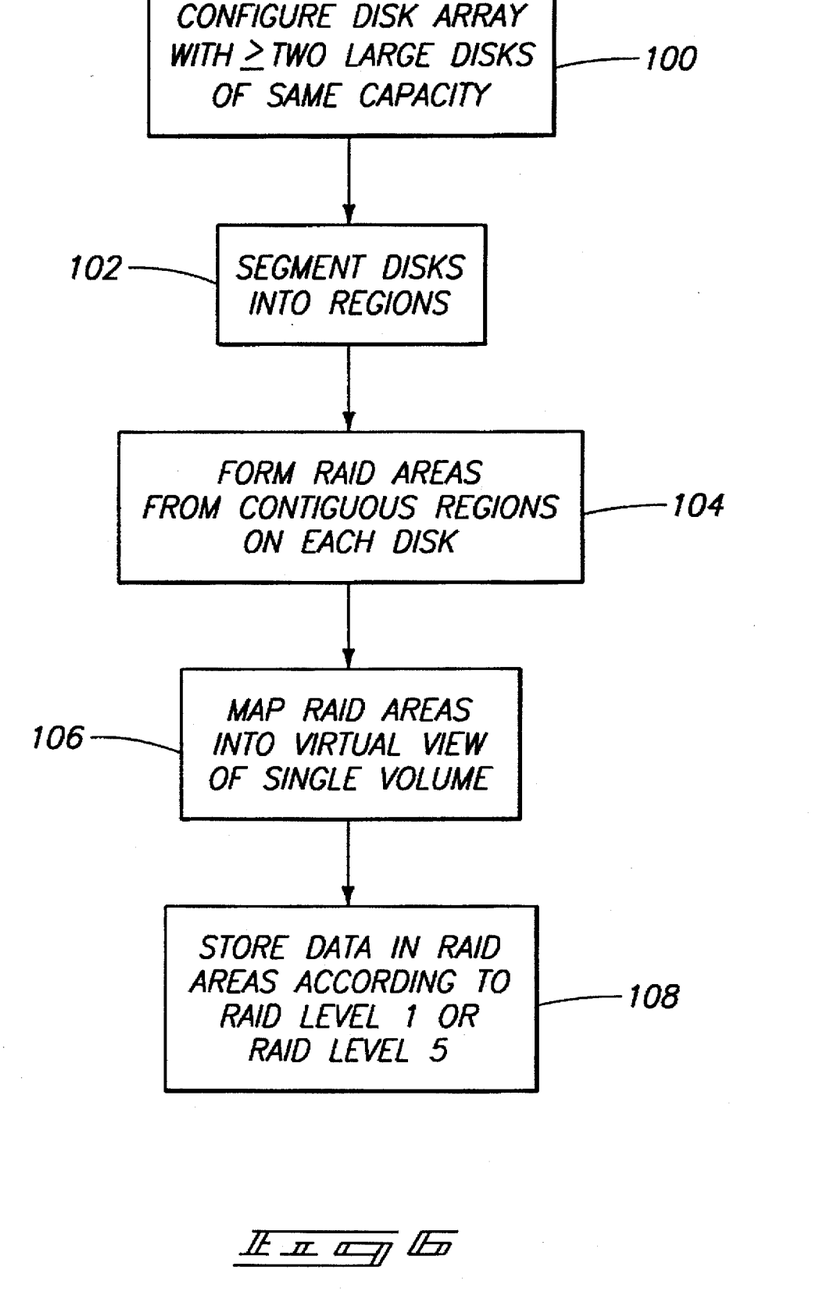
FIG. 6 is a flow diagram showing the steps of the method demonstrated in FIG. 5.

FIGS. 5 and 6 show a first method for fully utilizing storage capacity in a heterogenous disk array. This method employs a rule that a minimum of two storage disks of the largest capacity be present in the disk array configuration. Therefore, the first step 100 is to configure the disk array with two or more storage disks with equal capacity that exceeds the storage capacity of the remaining disks in the array. Here, a heterogenous disk array of uneven disks 0–4 are configured to include two large storage disks 1 and 4 which have the same capacity. This capacity is greater than the storage capacities of the other disks 0, 2, and 3.

At step 102, the storage disks 0–4 are segmented into multiple regions, which are referenced generally by numeral 35. Regions 35 are preferably of equal size throughout the disk array, and consist of one or more equal sized segments (see FIG. 4). The RAID areas A0–A4, etc., are then formed from contiguous regions on multiple storage disks (step 104). "Contiguous regions" are regions representing the physical storage spaces on different disks that all have the same physical address. For example, RAID areas A3, A4, etc. each include a region from all five storage disks 0–4 at the same physical address on each disk; RAID area A2 includes a region from four storage disks 0, 1, 3, and 4; and RAID areas A0 and A1 each include a region from disks 1 and 4.

At step 106, the RAID areas A0–A4 are mapped into a virtual view of a single volume, as described above in FIG. 4. Therefore, the method of this invention utilizes all storage space in the heterogenous disk array without having to characterize the array as independent volumes to the host computer. Instead, the entire heterogenous array can be presented as a single volume. Data is then stored in the contiguous RAID areas (as represented by the linear horizontal arrows) according to selected RAID levels, such as RAID Level 1 and/or RAID Level 5 (step 108). Each RAID area stores some redundant data.

This method is beneficial in that it permits utilization of the entire storage space on all storage disks in the heterogeneous, single volume disk array. To illustrate this point, the combined storage space of RAID areas A3, A4, and so on, can be defined as set 0. The storage space in set 0 is equivalent to the amount of storage space that prior art heterogeneous disk arrays made available. However, in prior art arrays, any disk capacity beyond the smallest capacity disk (i.e., disk 2) was not utilized, unless the design resorted to the more complex design of presenting numerous storage volumes.

According to the techniques of this invention, however, the additional capacity of disks 0, 1, 3, and 4 is utilized. RAID area A2 includes a region from storage disks 0, 1, 3, and 4, thereby defining an additional storage space of set 1 consisting of four disks. RAID areas A0 and A1 each include a region from disks 1 and 4, where this aggregate space defines set 2 of additional storage space. Therefore, the method of this invention allows full utilization of all disk space in all disks 0–4, thereby improving storage utilization over the prior art by as much as the space in sets 1 and 2.

It is noted that data can be stored in sets 0 and 1 (i.e., RAID areas A2, A3, A4, etc.) according to either RAID Level 1 or RAID Level 5. These RAID areas contain contiguous regions from three or more storage disks, thereby making parity storage possible. Data is stored in set 2 (i.e., RAID areas A0–A1) according RAID Level 1, or mirror redundancy. One disk is used to store the original data and the other disk is used to store the redundant data. Coincidentally, the same mirroring redundancy can be accomplished using RAID Level 5 in the two disk set. One disk is used to store the original data and the other disk is used to store the parity data. The parity data turns out to be identical to the original data, and hence effectively mirrors the original data.

Figure 8:
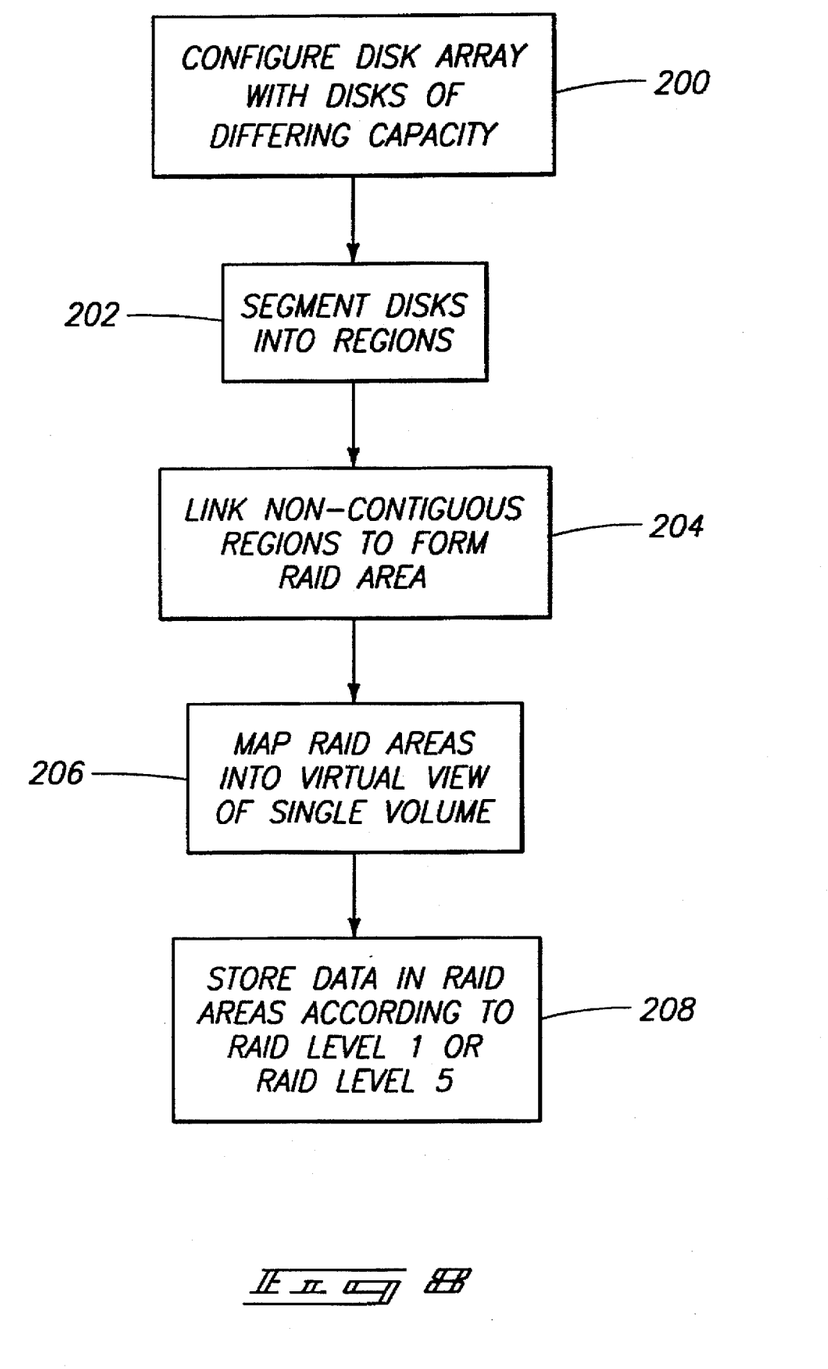
FIG. 8 is a flow diagram showing the steps of the method demonstrated in FIG. 7.
Figure 11:
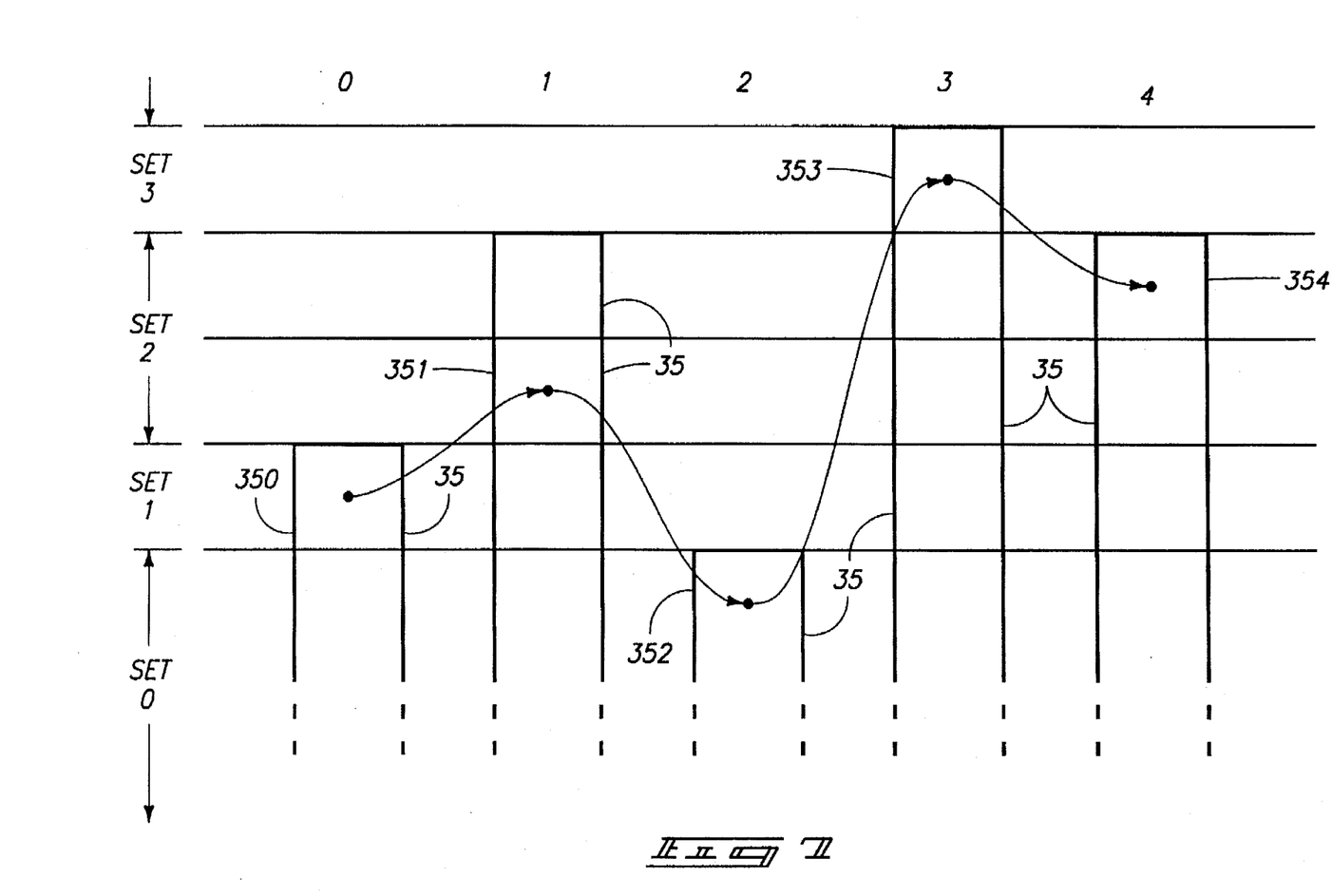

FIGS. 7 and 8 show a second method for fully utilizing storage capacity in a heterogenous disk array. This method differs from the first method in that it is suited for any heterogenous disk array (and for that matter, any homogenous disk array), regardless of the configuration. There is no configuration requirement of maintaining at least two largest-sized disks. The first step 200 is to simply configure the heterogenous disk array with storage disks of a differing capacity, such as that shown by uneven disks 0–4 in FIG. 7. Disk 3 has the largest capacity, followed by disks 1 and 4 which have the same capacity, followed by disk 0, and finally disk 2.

At step 202, the storage disks 0–4 are segmented into multiple, preferably equal-sized regions (which again are referenced generally by numeral 35). The next step 204 is to link non-contiguous regions from individual storage disks 0–4 to form various RAID areas. "Non-contiguous regions" are regions representing the physical storage space on different disks that have different physical addresses. Individual RAID areas consist of one region from all or a subset of each of the storage disks.

The linking process is illustrated graphically by the serpentine arrow that includes regions 350–354 of disks 0–4, respectively. The linking process is preferably implemented using a pointer chaining technique. A first table containing chain head pointers is used to locate various RAID areas. One chain head pointer identifies an associated RAID area. A second table containing secondary chain pointers is then used to reference specific regions within the identified RAID area. Both tables are stored in memory map store 21. By maintaining the pointer tables in the memory map store, the RAID areas can be easily reconstructed in the event that one or more disks fail.

A secondary linking process that is preferably employed concurrently with the pointer tables is to embed regional pointers on the storage disks in the regions of each RAID area. The regional pointers point from one region to the next region to be linked. For example, in FIG. 7, region 352 points to region 353 as the next location of memory to be linked as part of the associated RAID area. The pointers include the address of the next region, and in some cases, the address to the previous region. The series of pointers form a reference chain which allows the storage system to sift through the storage disks to reconstruct the RAID area. This secondary linking process can be used for recovery operations in the event of malfunction of disk array controller 14.

At step 206, the RAID areas formed of non-contiguous regions are mapped into a virtual storage space the presents the physical storage space on disks 0–4 as a single storage volume to the user or host. Data is then stored according to various RAID levels, including RAID Level 1 and RAID Level 5, where each RAID area stores some redundant data (step 208).

As storage capacity approaches full usage, data can be migrated to RAID Level 5 areas to optimize efficient use of the storage space. The proportion of data stored according to RAID Level 5 in relation to data stored according to RAID Level 1 thereby increases. RAID Level 5 uses less space for redundancy data. If all data were stored according to RAID Level 1, half of the storage space would be used for holding redundant data. For RAID Level 5 storage in a disk array of many storage disks, a much smaller fraction of the storage space is dedicated to redundant data. Accordingly, RAID Level 5 permits storage of more user data for a given disk array, but at a cost of lower performance and availability characteristics. Eventually, as storage capacity is filled, all data might be migrated to RAID Level 5 areas.

Both methods of this invention fully utilize the storage capacity of a heterogenous disk array to approximately the same extent. The second described method of linking non-contiguous areas affords slightly better flexibility and performance because the data can be spread more randomly throughout the disk array. This permits more uniform access to regions throughout the disk array.

The methods of this invention have the added benefit of promoting flexibility and adaptability to newer disks of even greater capacity. When maximum capacity on an existing disk array configuration is reached, one or more storage disks of greater capacity can be easily incorporated without fear of under utilizing the excess new space. The techniques described herein will allow the disk array to be reconfigured to utilize all space on all storage disks in the array.

The methods of this invention are advantageous in that they allow full utilization of storage disks of differing capacity in a heterogeneous hierarchic disk array. The invention achieves this without presenting the storage disks as multiple storage volumes, but instead presents them to the host computer system as a single volume.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for utilizing storage capacity in a data storage system having a heterogeneous hierarchic disk array of multiple storage disks of different physical storage capacities, the storage disks defining a total physical storage space; the method comprising the following steps:

(a) configuring the disk array to include at least two larger storage disks with equal physical storage capacity where the physical storage capacity of the at least two storage disks is greater than the physical storage capacities of other storage disks in the disk array;

(b) segmenting the storage disks in the disk array into multiple regions;

(c) forming RAID areas from contiguous regions on multiple storage disks, the contiguous regions for each RAID area representing physical storage space at a same physical address on individual storage disks;

(d) mapping the RAID areas into a virtual storage space that provides a view of the physical storage space as a single storage volume; and (e) storing data in the RAID areas according to selected RAID levels where each RAID area stores some redundant data.

2. A method according to claim 1 wherein the data stored in a RAID area is stored according to a RAID level selected from a group consisting of RAID Level 1 and RAID Level 5.

3. A method according to claim 1 wherein data is migrated to RAID Level 5 as storage capacity of the disk array approaches full usage so that a proportion of data stored in the disk array according to RAID Level 5 in relation to data stored in the disk array according to RAID Level 1 increases to thereby optimize efficient use of the physical storage space.

4. A method for utilizing storage capacity in a data storage system having a heterogeneous hierarchic disk array of multiple storage disks of different physical storage capacities, the storage disks defining a total physical storage space; the method comprising the following steps:

(a) configuring the disk array to include multiple storage disks having different physical storage capacities;

(b) segmenting the storage disks of different physical storage capacities into multiple regions;

(c) linking non-contiguous regions from individual storage disks to form RAID areas, the non-contiguous regions representing physical storage space at different physical addresses on the multiple storage disks;

(d) mapping the RAID areas into a virtual storage space that provides a view of the physical storage space as a single storage volume; and (e) storing data in the RAID areas according to selected RAID levels where each RAID area stores some redundant data.

5. A method according to claim 4 wherein the linking step (b) comprises connecting the non-contiguous regions using a pointer chaining technique where individual regions point to the next region in the linked RAID area.

6. A method according to claim 4 wherein the selected RAID levels for storing data in step (d) is chosen from a group consisting of RAID Level 1 and RAID Level 5.

7. A method according to claim 4 wherein data is migrated to RAID Level 5 as storage capacity of the disk array approaches full usage so that a proportion of data stored in the disk array according to RAID Level 5 in relation to data stored in the disk array according to RAID Level 1 increases to thereby optimize efficient use of the physical storage space.

8. A method for utilizing storage capacity in a data storage system having a heterogeneous hierarchic disk array of multiple storage disks of different physical storage capacities, comprising the following steps:

segmenting the storage disks of different physical storage capacities in the heterogeneous disk array into multiple regions;

forming first and second RAID areas from the regions of the storage disks;

storing data in the first RAID areas according to a first RAID level and in the second RAID areas according to a second RAID level; and migrating data from one of the first RAID areas to one of the second RAID areas so that data once stored according to the first RAID level is now stored according to the second RAID level.

* * * * *